(12) United States Patent
Miura

(10) Patent No.: US 7,605,532 B2
(45) Date of Patent: Oct. 20, 2009

(54) ORGANIC LIGHT EMITTING DEVICE

(75) Inventor: Seishi Miura, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 400 days.

(21) Appl. No.: 11/692,545

(22) Filed: Mar. 28, 2007

(65) Prior Publication Data
US 2007/0228948 A1 Oct. 4, 2007

(30) Foreign Application Priority Data
Mar. 31, 2006 (JP) .............................. 2006-097181
Mar. 16, 2007 (JP) .............................. 2007-068479

(51) Int. Cl.
H01J 1/62 (2006.01)
(52) U.S. Cl. ........................ 313/504; 428/690; 445/24
(58) Field of Classification Search ......... 313/498–512;
315/169.1, 169.3; 428/690–691, 917; 438/26–29,
438/34, 82; 257/40, 72, 98–100, 642–643,
257/759; 427/58, 64, 66, 532–535, 539;
445/24–25
See application file for complete search history.

(56) References Cited
U.S. PATENT DOCUMENTS

| 6,013,384 A | 1/2000 | Kido et al. ................. 428/690 |
| 6,838,818 B2 | 1/2005 | Furugori et al. ............. 313/504 |
| 2002/0086180 A1* | 7/2002 | Seo et al. ................... 428/690 |
| 2005/0260440 A1 | 11/2005 | Seo et al. ................... 428/690 |
| 2006/0289882 A1* | 12/2006 | Nishimura et al. ........... 257/94 |

FOREIGN PATENT DOCUMENTS

| JP | 10-270171 | 10/1998 |
| JP | 10-270172 | 10/1998 |
| JP | 2002-313583 | 10/2002 |
| JP | 2005-063910 | 3/2005 |

OTHER PUBLICATIONS

C.W. Tang et al., "Organic Electroluminescent Diodes", Appl. Phys. Lett., 51 (12), Sep. 12, 1987.

* cited by examiner

Primary Examiner—Peter J Macchiarolo
Assistant Examiner—Donald L Raleigh
(74) Attorney, Agent, or Firm—Fitzpatrick, Cella, Harper & Scinto

(57) ABSTRACT

An organic light emitting device has a light emitting layer and an electron injecting and transporting layer which are sandwiched between a pair of electrodes formed of an anode and a cathode. The electron injection dopant material is doped into an electron transporting material in such a manner that concentration of the dopant becomes low, high, and low in the regions of the electron injecting and transporting layer in the stated order from the light emitting layer side in the film thickness direction. Further, in the region brought into contact with the cathode of the electron injecting and transporting layer, the concentration of the dopant is preferably set high. The organic light emitting device improves drive durability and high light extraction efficiency.

5 Claims, 1 Drawing Sheet

ORGANIC LIGHT EMITTING DEVICE

BACKGROUND OF THE INVENTION

1. Field of the Invention

The present invention relates to an organic light emitting device and a manufacturing process for the same, and more particularly, to an organic light emitting device used as a multi-color light emitting device for use in flat panel displays, projection displays, printers, etc., and to a manufacturing process for the same.

2. Description of the Related Art

In recent years, self-light emitting devices for flat panels are attracting attention. The self-light emitting devices include plasma light emitting display devices, field emission devices and organic light emitting devices (electroluminescence (EL) devices).

As for the organic light emitting devices, in particular, T. W. Tang et al. verified in 1987 that high-intensity light emission can be obtained by low-voltage DC drive, making use of the structure of a laminate formed of a film of a fluorescent metal chelate complex and a thin film of diamine-based molecules, and research and development thereof are under way energetically.

The objects of the research and development of the organic light emitting device include a reduction in drive voltage, an improvement of light extraction efficiency and an improvement of drive deterioration characteristics. As means for attaining those objects, there are conventionally known prior art technologies for doping an electron injecting material into an organic compound layer.

That is, there is known a technology for reducing the drive voltage by using an electron transporting material and an alkali metal, alkali salt or alkali oxide as the materials of an electron injecting and transporting layer (refer to Japanese Patent Application Laid-Open No. 10-270171 and Japanese Patent Application Laid-Open No. 10-270172). There is also known a technology for reducing the drive voltage by providing a concentration gradient in which an amount of an electron injecting material is large on a side near a cathode and increases as a distance from a cathode becomes larger (refer to Japanese Patent Application Laid-Open No. 2002-313583). There is further known a technology for suppressing the deterioration with time by using a mixed layer of cesium carbonate and an electron transporting material which can be easily handled as an electron injecting and transporting layer, and by setting the concentration of a dopant in the layer to 8 wt % or less (refer to Japanese Patent Application Laid-Open No. 2005-63910).

However, as the result of studies of the inventor of the present invention, it has been found that doping an electron transporting material with an electron injection dopant material such as an alkali metal, or a salt or an oxide thereof in a high concentration induces a reduction in light extraction efficiency though it has the effect of reducing the drive voltage.

SUMMARY OF THE INVENTION

The present invention has been made in view of the above-mentioned problems, and it is an object of the present invention to provide a technology which can improve the drive durability and increase the light extraction efficiency of an organic light emitting device in which an electron transporting material is doped with an electron injection dopant material.

To attain the above-mentioned object, the present invention provides an organic light emitting device including: an anode and a cathode which are opposed to each other; a light emitting layer formed between the anode and the cathode; an electron injecting and transporting layer formed between the cathode and the light emitting layer and brought in contact with the cathode and the light emitting layer, in which the electron injecting and transporting layer contains an electron transporting material and cesium carbonate as an electron injection dopant material and has a first region, a second region, and a third region in the stated order from the light emitting layer side, which differ from one another in concentration of an electron injection dopant material, and the concentration of the electron injection dopant material in the second region is higher than the concentrations of the electron injection dopant material in the first region and the third region.

According to the organic light emitting device of the present invention, the drive durability can be improved without reducing the light extraction efficiency.

Further features of the present invention will become apparent from the following description of exemplary embodiments with reference to the attached drawings.

DESCRIPTION OF THE EMBODIMENTS

Hereinafter, descriptions will be made of embodiments of the organic light emitting device of the present invention. It should be noted that the organic light emitting device of the present invention is not limited to the following embodiments.

The organic light emitting device according to an embodiment of the present invention includes an anode and a cathode which are opposed to each other, a light emitting layer formed between the anode and the cathode, and an electron injecting and transporting layer which is formed between the cathode and the light emitting layer and brought into contact with the cathode and the light emitting layer. The electron injecting and transporting layer contains an electron transporting material and cesium carbonate as an electron injection dopant material and has a first region, a second region and a third region from the light emitting layer side which differ from one another in the concentration of the electron injection dopant material. The concentration of the electron injection dopant material in the second region is higher than the concentrations of the electron injection dopant material in the first region and the third region.

In this respect, the concentration of the electron injection dopant material decreases monotonously in the electron injecting and transporting layer in the technology disclosed by Japanese Patent Application Laid-Open No. 2002-313583. In contrast to this, in the organic light emitting device of the present invention, the electron injecting and transporting layer has three regions in which the concentrations of the electron injection dopant material are low, high and low in the stated order from the light emitting layer side in the film thickness direction. Due to this difference in construction, the organic light emitting device of the present invention can attain the improvement of light extraction efficiency and the suppression of drive deterioration.

Figure 1:
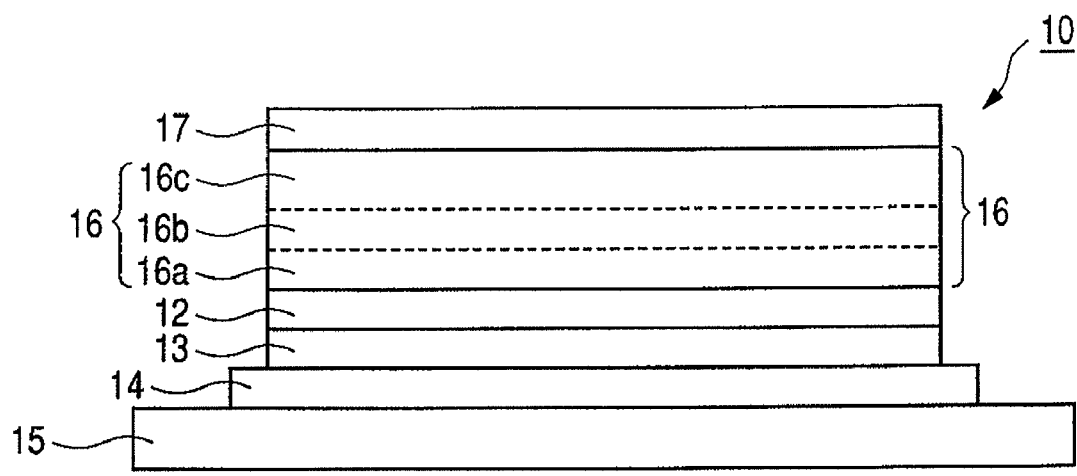
FIG. 1 is a longitudinal sectional view showing the schematic constitution of an organic light emitting device according to an embodiment of the present invention.

The organic light emitting device according to the embodiment of the present invention will be described with reference to the accompanying drawings. FIG. 1 is a longitudinal sectional view showing the schematic constitution of the organic light emitting device according to the embodiment of the present invention.

As shown in FIG. 1, the light emitting device 10 according to the embodiment of the present invention includes an anode 14, organic compound layers including a hole transporting layer 13, a light emitting layer 12 and an electron injecting and transporting layer 16, and a cathode 17 all of which are formed on a substrate 15 in the mentioned order.

Hereinafter, the material of each layer constituting the organic light emitting device 10 will be described in detail.

Examples of the substrate 15 include various glass substrates, glass substrates having a drive circuit such as a TFT made of polysilicon, and substrates having a drive circuit on a silicon wafer. Although the substrate 15 may not be transparent when light is extracted from the opposite side to the substrate 15, the substrate 15 is preferably transparent when light is extracted from the substrate 15 side.

As the material of the anode 14 is preferably selected a conductive material having a large work function. When light is extracted from the opposite side to the substrate 15, a metal material having a high reflectance is preferably selected. For example, a metal material such as Cr, Pt, Ag, Au, or an alloy thereof is preferably used. An anode having a thin film made of a transparent conductive material formed on a metal material having a high reflectance may be used. When a material having a large work function such as ITO is used as the transparent conductive material, a metal material having a large work function does not need to be always selected.

To extract light from the opposite side to the substrate 15, the cathode 17 is preferably transparent and may be made of a transparent conductive material such as ITO. A thin film having a thickness of 1 to 10 nm and made of a metal material may be used as the light transmissive cathode 17. Further, when a semi-light transmissive cathode 17 is used, the efficiency of extracting light to the outside and the color purity can be improved by making use of a light interference effect.

Examples of a hole transporting material that forms the hole transporting layer 13 include, but not limited to, low-molecular-weight compounds such as a triphenyldiamine derivative, an oxadiazole derivative, a polyphyrin derivative, and a stilbene derivative.

As the material of the light emitting layer 12 may be used a single material which obtains desired light emission or a host material doped with a guest material. That is, the host material and the guest material are vacuum deposited from the vapor at the same time and their vapor deposition rates are controlled to obtain a light emitting layer 12 having an arbitrary concentration of a dopant. When the light emitting layer 12 is to be formed, second and third dopant materials may be doped at suitable times.

Examples of an electron transporting material that forms the electron injecting and transporting layer 16 include, but not limited to, an aluminum quinolinol derivative, an oxadiazole derivative, a triazole derivative, a phenylquinoxaline derivative, and a silole derivative.

In the electron injecting and transporting layer 16, three regions 16a (first region) 16b (second region) and 16c (third region) are formed from the light emitting layer 12 side in the film thickness direction according to the concentration of the electron injection dopant material. In each region, cesium carbonate as an electron injection dopant material is doped into the electron transporting material in a desired concentration.

The concentration of the dopant in the region 16a is set to a value smaller than the average concentration of the dopant in the entire electron injecting and transporting layer 16. More specifically, the concentration of the dopant in the region 16a is preferably less than 1.0 wt %, more preferably 0.1 wt % or less, much more preferably about 0.01 wt %.

The concentration of the dopant in the region 16b is set to a value larger than the average concentration of the dopant in the entire electron injecting and transporting layer 16. More specifically, the concentration of the dopant in the region 16b is preferably 4.0 wt % or more to 6.0 wt % or less.

The concentration of the dopant in the region 16c is set to a value smaller than the average concentration of the dopant in the entire electron injecting and transporting layer 16. More specifically, the concentration of the dopant in the region 16c is preferably less than 1.0 wt %, more preferably 0.1 wt % or more in this range.

The electron injection dopant material is doped into the electron transporting material in the electron injecting and transporting layer 16 of this embodiment such that the central region 16b in the film thickness direction has a higher dopant concentration than those of the region 16a on the light emitting layer side and the region 16c on the cathode side. That is, in the regions 16a, 16b and 16c in the film thickness direction constituting the electron injecting and transporting layer 16, the concentration of the dopant becomes low, high, and low in the sated order from the light emitting layer 12 side.

By making the regions different from one another in the concentration of the electron injection dopant material, the drive durability can be improved without reducing the light extraction efficiency. It was found that the concentration of the dopant in the region 16b (second region) must be made high to improve the drive durability. However, when the concentrations of the dopant in the regions 16a (first region) and the region 16c (third region) were made as high as that of the second region, the drive durability could not be improved. Meanwhile, it was also found that when the concentration of the electron injection dopant material in the electron injecting and transporting layer is made high, the effect of extracting light emitted from the light emitting layer 12 to the outside lowers. Therefore, it is preferred that the concentrations of the dopant in the regions 16a and 16c in which the drive durability is not improved even when the concentration is made high should be set low. Therefore, it is preferred that the concentration of the electron injection dopant material in the region 16b (second region) should be made high whereas those in the region 16a (first region) and 16c (third region) should be made low in the electron injecting and transporting layer of the organic light emitting device of this embodiment. Thereby, an organic light emitting device which satisfies the requirements for drive durability and light extraction efficiency at the same time can be obtained.

Figure 2:
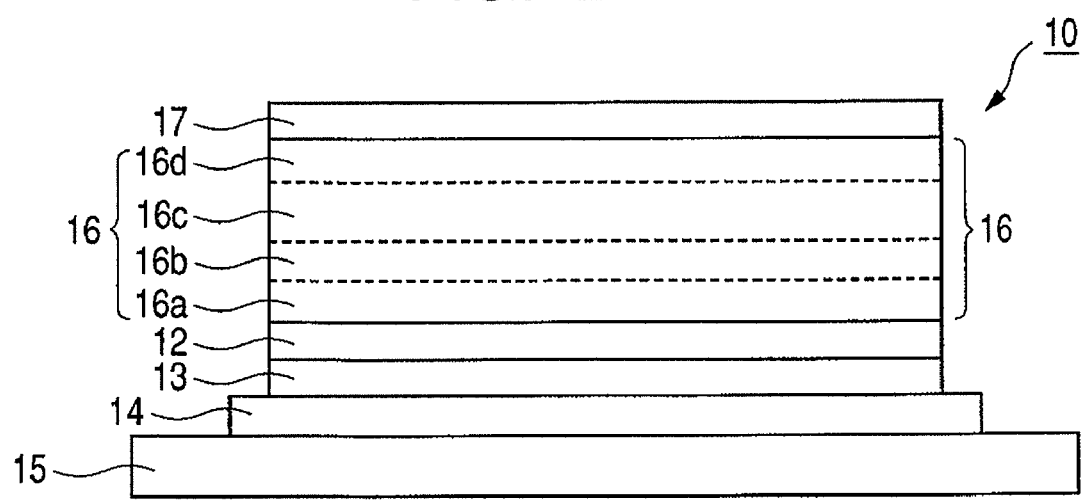
FIG. 2 is a longitudinal sectional view showing the schematic constitution of an organic light emitting device according to another embodiment of the present invention.

FIG. 2 is a sectional view of an organic light emitting device according to another embodiment. The same reference numbers as in FIG. 1 denote the same members as in FIG. 1. In the electron injecting and transporting layer of the organic emitting device according to this embodiment, as shown in FIG. 2, a region 16d (fourth region) which differs from the region 16c in the concentration of the electron injection dopant material is preferably formed on the cathode side of the region 16c. Since an obstacle to the injection of electrons into the electron injecting and transporting layer 16 from the cathode 17 can be reduced by making the concentration of the dopant in the region 16d higher than that in the region 16c, the drive voltage can be reduced.

The concentration of the dopant in the region 16d is set higher than the average concentration of the dopant in the entire electron injecting and transporting layer 16. More specifically, the concentration of the dopant in the region 16d is preferably 4.0 wt % or more to 6.0 wt % or less.

In the electron injecting and transporting layer 16 of the embodiment illustrated in FIG. 2, the electron injection dopant material is doped into the electron transporting material such that the concentration of the dopant in the central region 16b in the film thickness direction becomes higher than those in the region 16a on the light emitting layer side and the region 16c on the cathode side. The region 16d brought into contact with the cathode 17 is existent on the cathode 17 side of the cathode side region 16c constituting the electron injecting and transporting layer 16 and the concentration of the dopant in this region 16d is higher than that in the region 16c. Therefore, when the electron injecting and transporting layer 16 is seen as a whole, the concentration of the dopant becomes low, high, low, and high in the regions 16a, 16b, 16c, and 16d in the film thickness direction from the light emitting layer 12 side, respectively.

When the concentrations of the electron injection dopant material in these regions are set to the above numerical ranges, the drive durability can be improved and the drive voltage can be lowered without reducing the light extraction efficiency.

While the constitution of the organic light emitting device of the present invention has been described, the concentrations of the electron injection dopant material in the regions of the electron injecting and transporting layer may not be predetermined values in the film thickness direction. That is, the concentration of the electron injection dopant material in the vicinity of the interface between adjacent regions is a value between the concentrations of the electron injection dopant material in these regions and may have a concentration gradient.

The effect of the electron injecting and transporting layer used in the present invention will be described herein. As disclosed in Japanese Patent Application Laid-Open No. 2002-313583, it is known that a layer formed by co-depositing from the vapor of an alkali metal or an alkali metal compound and an electron transporting material can improve electron injection properties from the electrodes and has extremely low resistance. This effect is obtained by the interaction between the alkali metal or the alkali metal compound and the electron transporting material.

When electrons are injected from an electrode having a large work function such as ITO, drive voltage can be reduced at a higher concentration of the dopant. Meanwhile, transport characteristics in the electron injecting and transporting layer rarely depends on concentration, and excellent transport characteristics can be obtained even at a relatively low concentration.

In this electron injecting and transporting layer, optical absorption increases and the amount thereof grows as the concentration of the dopant increases due to its interaction. Therefore, to improve the light extraction efficiency, the number of regions having a high concentration of the dopant is made as small as possible.

Although details of the effect of improving durability which is obtained in the present invention are not made clear, it is assumed that this is due to the change of physical connection between the light emitting layer and the electron injecting and transporting layer caused by doping an alkali metal or an alkali metal compound into the electron transporting material. It is considered that by making the concentration of the dopant in the electron injecting and transporting layer low and high in the stated order from the light emitting layer side, the injection of electrons into the light emitting layer or the behavior of electron holes at the interface between the light emitting layer and the electron injecting and transporting layer changes, thereby improving the durability.

Those effects are expressed by the interaction between the alkali metal or the alkali metal compound and the electron transporting material and can be expected not only from cesium compounds but also from rubidium, potassium, sodium, lithium, and compounds thereof. Particularly cesium compounds have the greatest effects rather than their electron donation property.

Methods of forming the organic compound layers, the cathode, and the anode to be used in the present embodiment are not particularly limited. For example, an organic material can be formed into such layer by, for example, an electrolytic polymerization method, a casting method, a spin coating method, an immersion coating method, a screen printing method, a micromolding method, a microcontact printing method, a roll coating method, an ink-jet method, or an LB method may be used. A vacuum vapor deposition method, a CVD method, an electron beam vapor deposition method, a resistance heating vapor deposition method, a sputtering method, or the like can also be an effective method of forming the organic compound layers, the cathode, and the anode depending on a material to be used. In addition, the organic compound layers, the cathode, and the anode can be patterned into desired shapes by photolithography and an etching treatment. In addition, each of soft lithography and the ink-jet method is also an effective patterning method.

The thicknesses of the organic compound layers, cathode, and anode of the present invention, which are not particularly limited, are each preferably in the range of 0.1 nm or more to 10 μm or less.

Further, the plural organic light emitting devices obtained in this embodiment can be used in an information display portion of a display. The size of the display, which is not particularly limited, is preferably in the range of, for example, 1 inch to 30 inches. The number of pixels is not limited, and, for example, a QVGA (320×240 pixels), a VGA (640×480 pixels), an XGA (1024×768 pixels), an SXGA (1280×1024 pixels), a UXGA (1600×1200 pixels), or a QXGA (2048×1536 pixels) can be adopted. In addition, the display is preferably capable of displaying colors. In this case, each of a method involving independently arraying red, blue, and green light emitting devices to display colors and a method involving the use of a color filter may be employed. In addition, each of a simple matrix method and an active matrix method can be effectively employed for driving the apparatus.

To protect the organic light emitting device from water and oxygen contained in air, a cap is preferably formed on the organic light emitting device. In this case, to extract light from the film side of the substrate, a light transmissive member is preferably used as the material of the cap. For example, glass is used. A space may be formed between the cap and the organic light emitting device, and a desiccating agent may be filled into the space.

A film made of an inorganic material such as SiN or SiO, or a polymer material film may be formed on the organic light emitting device to insulate the organic light emitting device from the open air.

The following examples are given to further illustrate the organic light emitting device of the present invention. The organic light emitting device of the present invention is not limited to the following examples.

EXAMPLES 1 AND 2 AND COMPARATIVE EXAMPLES 1 TO 4

As described above, the organic light emitting device 10 of the present invention has the anode 14, organic compound layers formed of the hole transporting layer 13, the light emitting layer 12 and the electron injecting and transporting layer 16, and the cathode 17 all of which are formed on the substrate 15 in the mentioned order (see FIG. 1). In this case, the layers constituting the organic light emitting device 10 of examples of the present invention were made of the following materials.

That is, the substrate 15 was made of glass, and the anode 14 was composed of a lamination film formed of an Ag layer and an ITO layer. The hole transporting layer 13 was made of HT-1, the light emitting layer 12 was a co-deposition layer from the vapor of EM-1 and EM-2, and the electron injecting and transporting layer was a co-deposition layer from the vapor of ET-1 and cesium carbonate. Further, the cathode was composed of an ITO film.

Hereinafter, the production procedure of the organic light emitting devices of Examples 1 and 2 and Comparative Examples 1 to 4 will be described.

A 100 nm-thick silver film and a 20 nm-thick ITO film were formed on the glass substrate (No. 1737 manufactured by Corning Co., Ltd.) to form a transparent substrate (substrate 15) and patterned by photolithography to form a transparent electrode (anode 14).

This transparent electrode (anode 14) was washed with UV—$O_3$ under atmospheric pressure, and then the following organic compound layers were formed by vacuum vapor deposition making use of resistance heating in a vacuum chamber having a pressure of $10^{-4}$ Pa. Thereafter, an ITO film was formed by sputtering to obtain the organic light emitting devices 10 of Examples 1 and 2 and Comparative Examples 1 to 4.

The film thickness of each layer is as follows.

The hole transporting layer 13 was made of HT-1 (20 nm). The light emitting layer 12 was a co-deposited layer from the vapor of EM-1 and EM-2 (EM-1/EM-2 ratio=87:13) (20 nm). The electron injecting and transporting layer 16 was made of ET-1 or ET-2 (50 nm).

The chemical formulae of the materials used in Examples 1 and 2 and Comparative Examples 1 to 4 are given below.

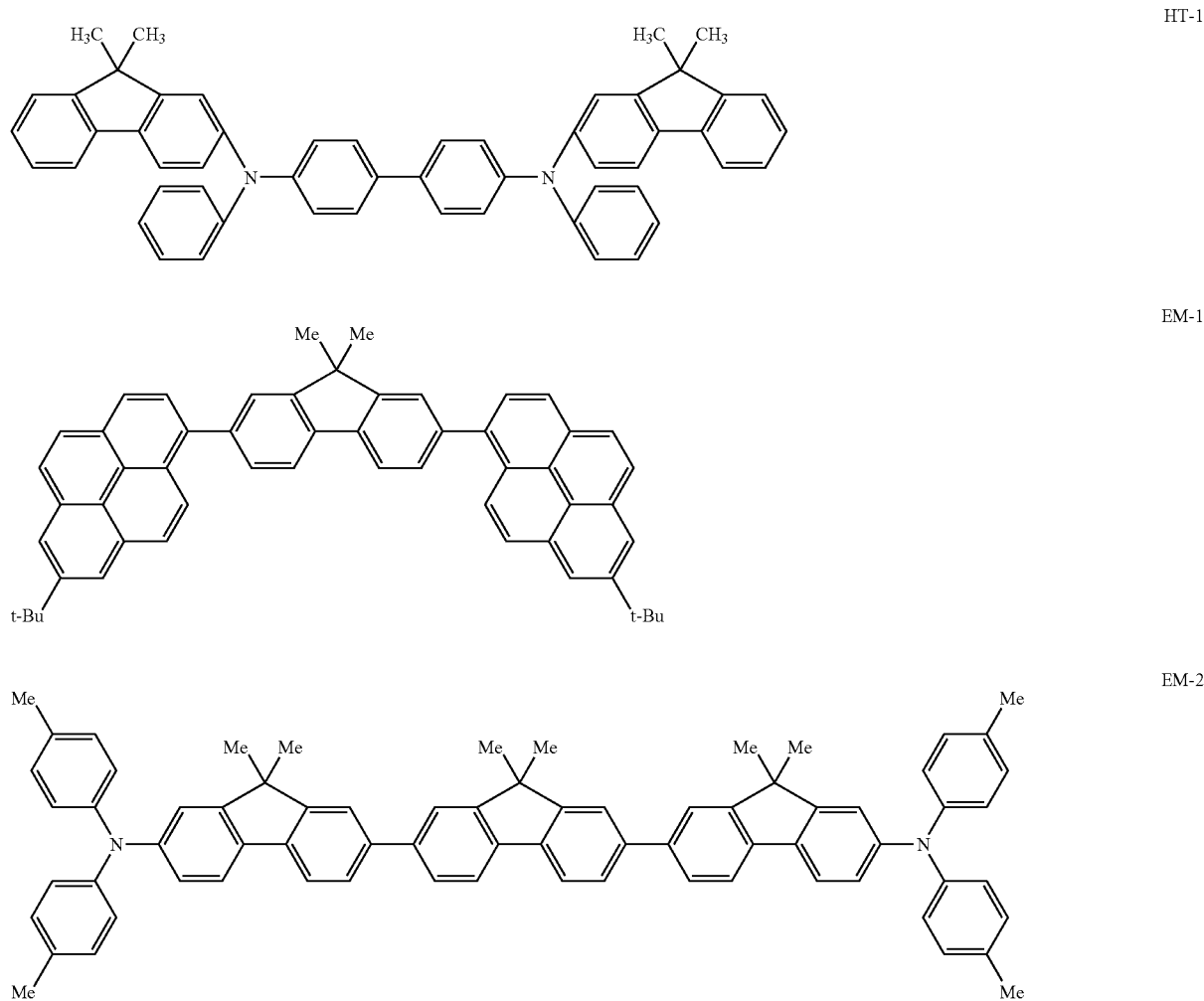

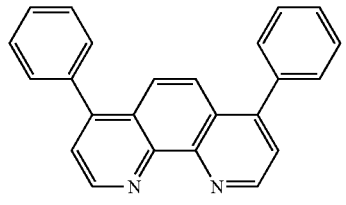

ET-1

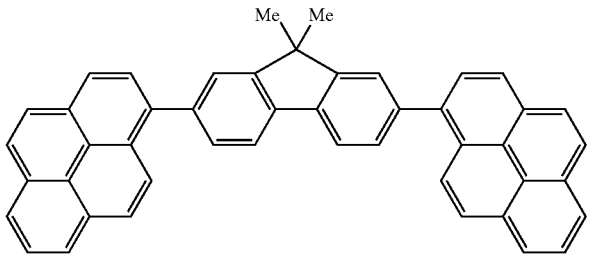

ET-2

The deposition speed in the vapor deposition step was controlled according to the concentration of cesium carbonate as a dopant in ET-1 to obtain a desired concentration. The materials in use, the film thicknesses and the characteristic properties of the formed devices are shown in Table 1.

20 mA/cm$^2$, the time elapsed before the luminance was reduced to 90% was about 127 hr. When a current of 20 mA/cm$^2$ was applied after a similar organic light emitting device to that of Example 1 which was fabricated under the

TABLE 1

| | Concentration of cesium carbonate (wt %) | | | | Evaluation results of characteristic properties | | | |
|---|---|---|---|---|---|---|---|---|
| | Region a 10 nm | Region b 10 nm | Region c 20 nm | Region d 10 nm | Luminance At 20 mA/cm$^2$ | Drive voltage At 20 mA/cm$^2$ | Time elapsed before luminance is reduced to 90% | Drive voltage after 200 days |
| Example 1 ET-1 | 0.01% | 5.1% | 0.5% | 4.9% | 463 | 3.1 | 127 | 3.3 |
| Comparative example 1 ET-1 | 0.01% | 4.9% | 4.9% | 4.9% | 402 | 3.1 | 135 | 3.1 |
| Comparative example 2 ET-1 | 0.005% | 0.5% | 0.5% | 0.5% | 514 | 3.5 | 20 | 3.5 |
| Example 2 ET-1 | 0.01% | 4.8% | 0.5% | 0.5% | 470 | 3.5 | 119 | 3.5 |
| Comparative example 3 ET-1 | 0.005% | 0.5% | 0.5% | 5.1% | 471 | 3.1 | 25 | 3.3 |
| Comparative example 4 ET-1 | 0.005% | 5.1% | 0% | 4.8% | 459 | 4.2 | 50 | 4.5 |
| Example 3 ET-2 | 0.01% | 5.2% | 0.5% | 5.1% | 431 | 3.2 | 121 | 3.2 |

The evaluation results of Examples and Comparative Examples will be described, hereinafter.

EXAMPLE 1

As shown in Table 1, the concentration of cesium carbonate in the electron injecting and transporting layer was set to 0.01% in the region a, 5.10% in the region b, 0.5% in the region c, and 4.9% in the region d to fabricate the organic light emitting device of Example 1. The region a, the region b, the region c, and the region d correspond to the regions 16a, 16b, 16c, and 16d in FIG. 1, respectively (the same shall apply in the following examples and comparative examples).

When the organic light emitting device of Example 1 was driven at a current density of 20 mA/cm$^2$, it had a luminance of 463 cd/m$^2$ and a drive voltage of 3.1 V. When the organic light emitting device of Example 1 was continuously driven at same conditions was kept at normal temperature for about 200 days, the light emitting device had a drive voltage of 3.3 V.

COMPARATIVE EXAMPLE 1

As shown in Table 1, the concentration of cesium carbonate in the electron injecting and transporting layer was set to 0.01% in the region a, 4.9% in the region b, 4.9% in the region c, and 4.9% in the region d to fabricate the organic light emitting device of Comparative Example 1.

When the organic light emitting device of Comparative Example 1 was driven at a current density of 20 mA/cm$^2$, it had a luminance of 402 cd/m$^2$ and a drive voltage of 3.1 V. That is, the luminance reduced as compared with Example 1. When the organic light emitting device of Comparative Example 1 was continuously driven at 20 mA/cm$^2$, the time elapsed before the luminance was reduced to 90% was about 135 hr which means that there was no big difference in Example 1. When a current of 20 mA/cm² was applied after a similar organic light emitting device to that of Comparative Example 1 which was fabricated under the same conditions was kept at normal temperature for about 200 days, the light emitting device had a drive voltage of 3.1 V.

COMPARATIVE EXAMPLE 2

The concentration of cesium carbonate in the electron injecting and transporting layer was set to 0.005% in the region a, 0.5% in the region b, 0.5% in the region c, and 0.5% in the region d to fabricate the organic light emitting device of Comparative Example 2.

When the organic light emitting device of Comparative Example 2 was driven at a current density of 20 mA/cm², it had a luminance of 514 cd/m² and a drive voltage of 3.5 V. That is, although the luminance improved, the drive voltage rose as compared with Example 1. When the organic light emitting device of Comparative Example 2 was continuously driven at 20 mA/cm², the time elapsed before the luminance was reduced to 90% was about 20 hr which means that it was very inferior in drive deterioration characteristics. When a current of 20 mA/cm² was applied after a similar organic light emitting device to that of Comparative Example 2 which was fabricated under the same conditions was kept at normal temperature for about 200 days, the light emitting device had a drive voltage of 3.5 V.

EXAMPLE 2

The concentration of cesium carbonate in the electron injecting and transporting layer was set to 0.01% in the region a, 4.8% in the region b, 0.5% in the region c, and 0.5% in the region d to fabricate the organic light emitting device of Example 2.

When the organic light emitting device of Example 2 was driven at a current density of 20 mA/cm², it had a luminance of 470 cd/m² and a drive voltage of 3.5 V. When the organic light emitting device of Example 2 was continuously driven at 20 mA/cm², the time elapsed before the luminance was reduced to 90% was about 119 hr. That is, though the drive voltage rose in Example 2 as compared with Comparative Example 1, the luminance improved and the durability was almost at the same level as that of Comparative Example 1. When a current of 20 mA/cm² was applied after a similar organic light emitting device to that of Example 2 which was fabricated under the same conditions was kept at normal temperature for about 200 days, the light emitting device had a drive voltage of 3.5 V.

COMPARATIVE EXAMPLE 3

The concentration of cesium carbonate in the electron injecting and transporting layer was set to 0.005% in the region a, 0.5% in the region b, 0.5% in the region c, and 5.1% in the region d to fabricate the organic light emitting device of Comparative Example 3.

When the organic light emitting device of Comparative Example 3 was driven at a current density of 20 mA/cm², it had a luminance of 471 cd/m² and a drive voltage of 3.1 V. When the organic light emitting device of Comparative Example 3 was continuously driven at 20 mA/cm², the time elapsed before the luminance was reduced to 90% was about 25 hr. That is, though the luminance improved in Comparative Example 3 as compared with Example 1, drive deterioration characteristics of Comparative Example 3 was very inferior to those of Example 1. When a current of 20 mA/cm² was applied after a similar organic light emitting device to that of Comparative Example 3 which was fabricated under the same conditions was kept at normal temperature for about 200 days, the light emitting device had a drive voltage of 3.3 V.

COMPARATIVE EXAMPLE 4

As shown in Table 1, the concentration of cesium carbonate in the electron injecting and transporting layer was set to 0.005% in the region a, 5.1% in the region b, 0% in the region c, and 4.8% in the region d to fabricate the organic light emitting device of Comparative Example 4.

When the organic light emitting device of Comparative Example 4 was driven at a current density of 20 mA/cm², it had a luminance of 459 cd/m² and a drive voltage of 4.2 V. When the organic light emitting device of Comparative Example 4 was continuously driven at 20 mA/cm², the time elapsed before the luminance was reduced to 90% was about 50 hr. The organic light emitting device of Comparative Example 4 is slightly inferior in luminance and much inferior in drive voltage and drive deterioration characteristics to those of Examples 1 and 2. When a current of 20 mA/cm² was applied after a similar organic light emitting device to that of Comparative Example 4 which was fabricated under the same conditions was kept at normal temperature for about 200 days, the light emitting device had a drive voltage of 4.5 V.

EXAMPLE 3

The organic light emitting device of Example 3 was fabricated in the same manner as in Example 1 except that a co-deposited layer from the vapor of ET-2 and cesium carbonate was used as the electron injecting and transporting layer.

When the organic light emitting device of Example 3 was driven at a current density of 20 mA/cm², it had a luminance of 431 cd/m² and a drive voltage of 3.2 V. When the device of Example 3 was continuously driven at 20 mA/cm², the time elapsed before the luminance was reduced to 90% was about 121 hr. In Example 3, the drive voltage and the drive deterioration characteristics were almost at the same level as those of Example 1 and Example 2. When a current of 20 mA/cm² was applied after a similar organic light emitting device to that of Example 3 which was fabricated under the same conditions was kept at normal temperature for about 200 days, the light emitting device had a drive voltage of 3.2 V.

As described above, according to the present invention, it is understood that by setting the concentration of the dopant in the electron injecting and transporting layer low, high, low, and high in the film thickness direction from the light emitting layer side, the drive voltage can be reduced and the drive durability can be improved without reducing the light extraction efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-097181, filed Mar. 31, 2006, and No. 2007-068479, filed Mar. 16, 2007, which are hereby incorporated by reference herein their entirety.

What is claimed is:

1. An organic light emitting device comprising:
an anode and a cathode which are opposed to each other;
a light emitting layer formed between the anode and the cathode;
an electron injecting and transporting layer formed between the cathode and the light emitting layer and brought into contact with the cathode and the light emitting layer, wherein:
the electron injecting and transporting layer contains an electron transporting material and cesium carbonate as an electron injection dopant material and has a first region, a second region, and a third region in the stated order from the light emitting layer side which differ from one another in concentration of an electron injection dopant material; and
the concentration of the electron injection dopant material in the second region is higher than the concentrations of the electron injection dopant material in the first region and the third region.

2. The organic light emitting device according to claim 1, wherein the electron injecting and transporting layer has a fourth region between the third region and the cathode, and the concentration of the electron injection dopant material in the fourth region is higher than the concentration of the electron injection dopant material in the third region.

3. The organic light emitting device according to claim 1, wherein the concentration of the electron injection dopant material is 0.01 wt % or less in the first region, 4 wt % or more to 6 wt % or less in the second region, and 0.1 or more to 1 wt % or less in the third region.

4. The organic light emitting device according to claim 2, wherein the concentration of the electron injection dopant material is 4 wt % or more to 6 wt % or less in the fourth region.

5. The organic light emitting device according to claim 1, wherein the thickness of the second region of the electron injecting and transporting layer is 5 nm or more to 20 nm or less.

* * * * *